(12) United States Patent
Konishi

(10) Patent No.: US 8,105,462 B2
(45) Date of Patent: Jan. 31, 2012

(54) TRANSFER METHOD OF ADHESIVE FILM

(75) Inventor: Misao Konishi, Kanuma (JP)

(73) Assignees: Sony Corporation, Minato-Ku, Tokyo (JP); Sony Chemical & Informational Device Corp., Shinigawa-Ku, Tokyo (JP)

(*) Notice: Subject to any disclaimer, the term of this patent is extended or adjusted under 35 U.S.C. 154(b) by 203 days.

(21) Appl. No.: 12/603,753

(22) Filed: Oct. 22, 2009

(65) Prior Publication Data

US 2010/0071841 A1  Mar. 25, 2010

Related U.S. Application Data

(63) Continuation of application No. PCT/JP2009/051742, filed on Feb. 3, 2009.

(30) Foreign Application Priority Data

Feb. 5, 2008  (JP) ................................. 2008-024723

(51) Int. Cl.
```
B29C 63/02    (2006.01)
B29C 65/18    (2006.01)
B29C 65/50    (2006.01)
C08J 5/18     (2006.01)
B32B 37/02    (2006.01)
B32B 37/06    (2006.01)
B32B 37/12    (2006.01)
B32B 38/10    (2006.01)
B32B 38/04    (2006.01)
B32B 38/18    (2006.01)
B29C 65/78    (2006.01)
B30B 15/34    (2006.01)
```
(52) U.S. Cl. ...................... 156/711; 156/309.9; 156/321; 156/379.9; 156/583.1; 156/583.4; 156/752

(58) Field of Classification Search ............... 156/309.9, 156/321, 711, 379.9, 583.1, 583.4, 752
See application file for complete search history.

(56) References Cited

U.S. PATENT DOCUMENTS 6,164,357 A * 12/2000 Ochi et al. ..................... 156/387
(Continued)

FOREIGN PATENT DOCUMENTS

JP      2-99575 A      4/1990
(Continued)

OTHER PUBLICATIONS

English translation (claims and description) of JP2002-334905—Takahashi Isao; Nov. 22, 2002.*

(Continued)

*Primary Examiner* — Sonya Mazumdar
(74) *Attorney, Agent, or Firm* — Buchanan Ingersoll & Rooney PC

(57) ABSTRACT

A method for transferring an adhesive film, which contains: conveying the adhesive film to an area between the heating part and the adherend; pressurizing the adhesive film with the heating part from the side of the release layer and heating the adhesive layer up to a first heating temperature so as to bring the adhesive layer into contact with the adherend; bringing a high temperature heating part, which is disposed downstream of the heating part with respect to the conveyance direction of the adhesive film, into contact with the adhesive film from the side of the release layer, and heating the adhesive layer up to a second heating temperature so as to cut the adhesive layer; and releasing the release layer from the adhesive layer which is in contact with the adherend, and transferring the adhesive layer which is in contact with the adherend to the adherend.

8 Claims, 5 Drawing Sheets

U.S. PATENT DOCUMENTS

| | | | | |
|---|---|---|---|---|
| 7,135,081 | B2 * | 11/2006 | Yamamoto | 156/73.6 |
| 7,513,284 | B2 * | 4/2009 | Onituka | 156/362 |
| 7,934,531 | B2 * | 5/2011 | Book | 156/547 |

FOREIGN PATENT DOCUMENTS

| | | |
|---|---|---|
| JP | 10-240148 | 9/1998 |
| JP | 2001-293686 | 10/2001 |
| JP | 2002-334905 A | 11/2002 |
| JP | 2006-93518 A | 4/2006 |
| JP | 2006-284830 | 10/2006 |
| JP | 2007-027560 | 2/2007 |
| JP | 2007-030085 A | 2/2007 |
| JP | 2007-154119 A | 6/2007 |
| JP | 2008-028132 | 2/2008 |

OTHER PUBLICATIONS

English translation (claims and description) of JP2008-028132—Musha Hitoshi; Feb. 7, 2008.*

English translation (claims and description) of JP2007-030085—Kamikubo Isato; Feb. 8, 2007.*

English translation (claims and description) of JP2006-093518—Harayama Kazuyuki; Apr. 6, 2006.*

English translation of Search Report of PCT/JP2009/051742—Apr. 14, 2009; Japanese Patent Office.*

English translation (claims and description) of JP2007-027560—Sakata Shigeru; Feb. 1, 2007.*

English translation of JP 10-240148; Sep. 11, 1998.*

English translation of JP 2001-293686; Oct. 23, 2001.*

English translation of JP 2006-284830; Oct. 19, 2006.*

English translation of Taiwanese Search Report for App No. TW0981 03988—Aug. 30, 2011.*

Extended European Search Report dated May 4, 2010 issued in the corresponding European Application No. 09 70 8886.

International Search Report for PCT/JP2009/051742 (in English), completed Apr. 1, 2009.

Written Opinion for PCT/JP2009/051742 (in Japanese), completed Apr. 1, 2009.

Office Action dated Aug. 30, 2011, issued in the corresponding Taiwanese Patent Application No. 098103988.

* cited by examiner

TRANSFER METHOD OF ADHESIVE FILM

CROSS-REFERENCE TO RELATED APPLICATION

This is a continuation of Application No. PCT/JP2009/051742, filed on Feb. 3, 2009.

BACKGROUND OF THE INVENTION

1. Field of the Invention

The present invention relates to a transfer method of an adhesive film, and especially relates to a method for adhering an adhesive film (adhesive tape) for mounting in a width of a several millimeters, represented by an anisotropic conductive film (ACF) or the like, to an adherend.

2. Description of the Related Art

Anisotropic conductive films (ACF) have conventionally been used as means for connecting electronic parts and a circuit board, and the like. The anisotropic conductive film is used for adhering and electrically connecting various terminals to each other, including the case for connecting a flexible print circuit or terminals of IC chip to an indium tin oxide (ITO) electrode formed on a glass substrate of a LCD panel.

The adhesion (transfer) of an adhesive film, represented by this anisotropic conductive film (ACF) or the like, to an adherend has been carried out in the manner described in the following (1) to (4).

(1) At first, as shown in FIG. 2A, a knife 17 is inserted into an adhesive film consisted of a base film (release layer) 11 and an ACF layer (adhesive layer) 12 from the side of the ACF layer 12, only the ACF layer 12 is cut 12d at the predetermined length and the predetermined width (approximately 100 μm) to thereby carry out a half cut (for example, see Japanese Application Laid-Open (JP-A) No. 2006-93518). At the time of this half cut, the attention should be taken not to cut the base film.

(2) Next, as shown in FIGS. 2B and 2C, the adhesive film is pressurized with a heating head 14 of a preattachment device from the side of the base film 11, and the ACF film 12 is brought into contact with a panel (adherend) 15 while being heated, to thereby temporarily adhere to a connection section of the panel 15, which is in the size of several millimeters to several centimeters.

(3) Thereafter, the base film 11 is peeled (as the cut 12d having the predetermined length has been formed in the ACF layer 12, only the ACF layer 12 having the predetermined length, which is in contact with the panel 15, is remained on the panel 15).

(4) The ACF layer is connected with IC or wiring, and then is pressure bonded, completely.

At the time when the knife is inserted into the ACF layer for the half cut described in (1), contaminants attached to the knife are mixed in the ACF layer, lowering the quality of the final product. Moreover, in the case of the half cut, there is a problem in the cost, as the maintenance is necessary for the knife to be inserted into the ACF layer, such as the regular replacement of the knife. Furthermore, failures in the half cut (insufficient cut and the like) are occurred unless the conditions for the half cut are sufficiently controlled (managed), the cutting of the ACF layer becomes insufficient (cutting failure of the ACF layer), which causes bonding failures 18 (FIGS. 2D to 2F). In order to prevent the bonding failures, a cut-out system, in which two knives 17 are inserted from the side of the ACF layer 12 (half cut in two places) and the cut-out whose width is larger than that in the half cut of (1) is formed, may be carried out (for example, see JP-A No. 2007-30085) as shown in FIGS. 3A and 3B. However, in this cut-out system, the portions of the ACF layer where are cut out 12e are wasted, and the production cost becomes high. In addition, as well as the half cut of (1), this system is necessary to sufficiently control (manage) the conditions for the half cut.

Moreover, as an adhesive film (adhesive tape), ones in which a softening point of an adhesive is specified have been used (for example, see JP-A No. 2007-154119).

BRIEF SUMMARY OF THE INVENTION

The present invention aims to solve the aforementioned problems in the art, and to achieve the following object. The object of the present invention is to provide a method for transferring an adhesive film, which is capable of preventing defects or loss of edge portions of the transferred adhesive layer to the adherend so as to ensure the contact area of the adherend and the adhesive layer, and hence is capable of improving the adhesive strength of the adhesive layer to the adherend, as well as improving a stability of the product quality by preventing contaminants from being mixed in the adhesive layer.

The means for solving the aforementioned problems are as follows.

<1> A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method containing:

conveying the adhesive film to an area between the heating part and the adherend;

pressurizing the adhesive film with the heating part from the side of the release layer and heating the adhesive layer up to a first heating temperature so as to bring the adhesive layer into contact with the adherend;

bringing a high temperature heating part, which is disposed downstream of the heating part with respect to the conveyance direction of the adhesive film, into contact with the adhesive film from the side of the release layer, and heating the adhesive layer up to a second heating temperature so as to cut the adhesive layer; and releasing the release layer from the adhesive layer which is in contact with the adherend, and transferring the adhesive layer which is in contact with the adherend to the adherend.

In accordance with the method for transferring an adhesive layer, the adhesive film is conveyed to an area between the heating part and the adherend in the conveying step, the adhesive film is pressurized with the heating part from the side of the release layer and the adhesive layer is heated up to the first heating temperature to thereby being in contact with the adherend in the pressurizing step, the high temperature heating part, which is disposed downstream of the heating part with respect to the conveyance direction of the adhesive film, is brought into contact with the adhesive film from the side of the release layer, and the adhesive layer is heated up to the second heating temperature so as to be cut in the cutting step, and the release layer is released from the adhesive layer which is in contact with the adherend so as to transfer the adhesive layer which is in contact with the adherend to the adherend in the transferring step. As a result, defects or loss of edge portions of the transferred adhesive layer to the adherend are prevented to thereby ensure the contact area of the adherend and the adhesive layer, and hence the adhesive strength of the adhesive layer to the adherend is improved, as well as improving a stability of the product quality by preventing contaminants from being mixed in the adhesive layer.

<2> A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method containing:

conveying the adhesive film to an area between the heating part and the adherend;

bringing a high temperature heating part, which is disposed upstream of the heating part with respect to the conveyance direction of the adhesive film, into contact with the adhesive film from the side of the release layer, and heating the adhesive layer up to a second heating temperature so as to cut the adhesive layer;

pressurizing the adhesive film with the heating part from the side of the release layer and heating the adhesive layer up to a first heating temperature so as to bring the adhesive layer into contact with the adherend; and releasing the release layer from the adhesive layer which is in contact with the adherend, and transferring the adhesive layer which is in contact with the adherend to the adherend.

In accordance with the method for transferring an adhesive layer, the adhesive film is conveyed to an area between the heating part and the adherend in the conveying step, the high temperature heating part, which is disposed upstream of the heating part with respect to the conveyance direction of the adhesive film, is brought into contact with the adhesive film from the side of the release layer, and the adhesive layer is heated up to the second heating temperature so as to be cut in the cutting step, the adhesive film is pressurized with the heating part from the side of the release layer and the adhesive layer is heated up to the first heating temperature to thereby being in contact with the adherend in the pressurizing step, and the release layer is released from the adhesive layer which is in contact with the adherend so as to transfer the adhesive layer which is in contact with the adherend to the adherend in the transferring step. As a result, defects or loss of edge portions of the transferred adhesive layer to the adherend are prevented to thereby ensure the contact area of the adherend and the adhesive layer, and hence the adhesive strength of the adhesive layer to the adherend is improved, as well as improving a stability of the product quality by preventing contaminants from being mixed in the adhesive layer <3> A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method containing:

conveying the adhesive film to an area between the heating part and the adherend;

pressurizing the adhesive film with the heating part from the side of the release layer and heating the adhesive layer up to a first heating temperature so as to bring the adhesive layer into contact with the adherend;

bringing a high temperature heating part, which is disposed downstream of the heating part with respect to the conveyance direction of the adhesive film, into contact with the adhesive film from the side of the release layer, and heating the adhesive layer up to a second heating temperature so as to cut the adhesive layer; and releasing the release layer from the adhesive layer which is in contact with the adherend, and transferring the adhesive layer which is in contact with the adherend to the adherend, wherein the pressurizing and the bringing are carried out simultaneously.

In accordance with the method for transferring an adhesive layer, the adhesive film is conveyed to an area between the heating part and the adherend in the conveying step, the adhesive film is pressurized with the heating part from the side of the release layer and the adhesive layer is heated up to the first heating temperature to thereby being in contact with the adherend in the pressurizing step, the high temperature heating part, which is disposed downstream of the heating part with respect to the conveyance direction of the adhesive film, is brought into contact with the adhesive film from the side of the release layer, and the adhesive layer is heated up to the second heating temperature so as to be cut in the cutting step that is simultaneously carried out with the pressurizing step, and the release layer is released from the adhesive layer which is in contact with the adherend so as to transfer the adhesive layer which is in contact with the adherend to the adherend in the transferring step. As a result, defects or loss of edge portions of the transferred adhesive layer to the adherend are prevented to thereby ensure the contact area of the adherend and the adhesive layer, and hence the adhesive strength of the adhesive layer to the adherend is improved, as well as improving a stability of the product quality by preventing contaminants from being mixed in the adhesive layer.

<4> The method for transferring the adhesive film according to any one of <1> to <3>, wherein the adhesive film has a width of 1 mm to 20 mm.

<5> The method for transferring the adhesive film according to any one of <1> to <4>, wherein the adhesive layer contains a binder resin and a curing agent, the binder resin comprising at least one of epoxy resin and acryl resin.

<6> The method for transferring the adhesive film according to <5>, wherein the second heating temperature is in the range of 50° C. to 190° C.

<7> The method for transferring the adhesive film according to any one of <1> to <6>, wherein the adhesive layer comprises conductive particles.

<8> The method for transferring the adhesive film according to any one of <1> to <7>, wherein the heating part and the high temperature heating part are integrated.

According to the present invention, the various problems in the art can be solved, and there can be provided a method for transferring an adhesive film, which is capable of preventing defects or loss of edge portions of the transferred adhesive layer to the adherend so as to ensure the contact area of the adherend and the adhesive layer, and hence is capable of improving the adhesive strength of the adhesive layer to the adherend, as well as improving a stability of the product quality by preventing contaminants from being mixed in the adhesive layer.

Moreover, according to the present invention, there can be provided a method for transferring an adhesive film, which is capable of simplifying the structure of a preattachment device by simplifying the step for transferring the adhesive film, as well as easily controlling (managing) the cutting conditions of the adhesive layer.

DETAILED DESCRIPTION OF THE INVENTION

Method for Transferring Adhesive Film

Figure 1A:
FIG. 1A is a schematic explanatory diagram showing one example of a conveying step in the method for transferring an adhesive film of the present invention.

The method for transferring an adhesive film of the present invention contains at least a conveying step, pressurizing step, cutting step, and transferring step, and may further contain other steps suitably selected depending on the intended purpose, if necessary.

<Adhesive Film>

The adhesive film is suitably selected depending on the intended purpose without any restriction, provided that is contains a release layer and an adhesive layer. Examples thereof include an adhesive tape having a width of 1 mm to 20 mm.

—Release Layer—

The release layer is suitably selected depending on the intended purpose without any restriction in the shape, structure, size, thickness, material (quality of material) thereof. The release layer is preferably those having excellent releasing property or high heat resistance. Suitable examples of the release layer include a transparent release polyethylene terephthalate (PET) sheet onto which a releasing agent such as silicone is applied.

—Adhesive Layer—

The adhesive layer is suitably selected depending on the intended purpose without any restriction in the shape, structure, size, thickness and material (quality of material) thereof, provided that it is softened by heat. Examples thereof include an adhesive layer containing a binder resin and a curing agent. In addition, the adhesive layer can be either a NCF layer containing no conductive particles, or an ACF layer containing conductive particles. The thickness of the adhesive layer is preferably approximately 20 μm (10 μm to 50 μm).

—Binder Resin—

The binder resin is preferably formed of at least one resin selected from epoxy resin and acryl resin.

The epoxy resin is suitably selected depending on the intended purpose without any restriction. Examples of the epoxy resin include bisphenol A epoxy resin, bisphenol F epoxy resin, and novlac epoxy resin. These may be used singly, or in combination of two or more.

The acryl resin is suitably selected depending on the intended purpose without any restriction. Examples of the acryl resin include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetracrylate, 2-hydroxy-1,3-diacryloxy propane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used singly, or in combination of two or more.

Moreover, as examples of the acryl resin, those replacing acrylate listed above with methacrylate, and these may be used singly or in combination of two or more.

—Curing Agent—

The curing agent is suitably selected depending on the intended purpose without any restriction, provided that it is capable of curing the binder resin. Examples thereof include an amine curing agent for the epoxy resin, and organic peroxide for the acryl resin.

—Conductive Particles—

As the conductive particles, those having the same structure as the one used in the conventional anisotropic conductive adhesive can be used, without any restriction. Examples of the conductive particles include: metal particles of solder, nickel, or the like; resin particles, glass particles or ceramic particles which are covered and plated with a metal (nickel, gold, aluminum, cupper, or the like); aforementioned particles covered with a insulating material; and the like. As a result of the use of these conductive particles, unevenness formed on terminals to be connected and the substrate wiring are absorbed, and thus a process margin can be assured at the time of the manufacturing. In addition, even when the connecting point is disconnected by pressure, the conductivity can be ensured and thus high reliability can be attained.

Among the conductive particles mentioned above, the metal-coated resin particles, e.g. nickel plated resin particles, are preferably, and insulating particles in which the metal coated resin particles are further coated with an insulating resin, are more preferable as they can prevent a short circuit caused when the conductive particles are located between the terminals.

Moreover, the adhesive layer may further contain other components. The aforementioned other components may be suitably selected from additives known in the art depending on the intended purpose without any restriction, provided that these do not adversely affect the effect of the present invention. Examples thereof include filler, a softening agent, an accelerator, an antioxidant, a colorant, a flame retardant, and a silane coupling agent.

<Conveying Step>

The conveying step is conveying the adhesive film to an area between the heating part and the adherend. For example as shown in FIG. 1A, the adhesive film 13 including the base film (release layer) 11 and the adhesive layer 12 is conveyed to the place between the heating head (heating part) 14 and the panel (adherend) 15 by means of a conveyance means (not shown in the figure) in the conveying step. Note that, in FIG.

1A, the direction shown with the arrow A is the conveyance direction of the adhesive film 13. Here, the adhesive film 13 is conveyed so that the base film 11 and the heating head 14 are faced and the adhesive layer 12 and the panel 15 are faced. Moreover, the heating head 14 is previously heated so as to heat the adhesive film 13 up to the first heating temperature.

<Pressurizing Step>

Figure 1B:
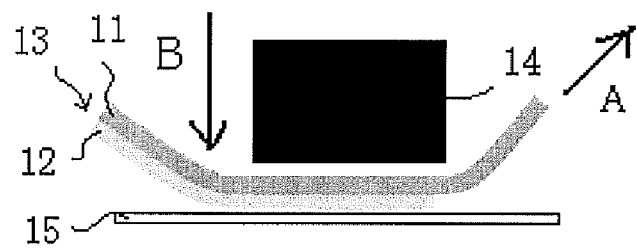
FIG. 1B is a schematic explanatory diagram showing one example of a pressurizing step in the method for transferring an adhesive film of the present invention.

The pressurizing step is pressurizing the adhesive film with the heating part from the side of the release layer and heating the adhesive layer up to the first heating temperature so as to bring the adhesive film into contact with the adherend. For example as shown in FIG. 1B, the adhesive film 13 is pressurized from the side of the base film 11 by pressing down the heating head 14 in the direction shown with the arrow B, and the adhesive layer 12 is heated up to the first heating temperature to thereby be in contact with the panel 15 in the pressurizing step. Here, the first heating temperature is a temperature for preattaching when the adhesive layer 12 is in contact with the panel 15, and is as general, preferably 40° C. to 120° C., more preferably 60° C. to 100° C.

<Cutting Step>

Figure 1C:
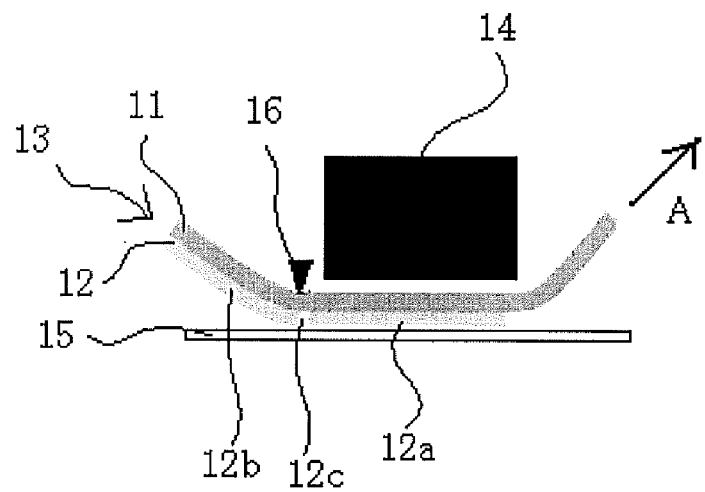
FIG. 1C is a schematic explanatory diagram showing one example of a cutting step in the method for transferring an adhesive film of the present invention (part 1).
Figure 1D:
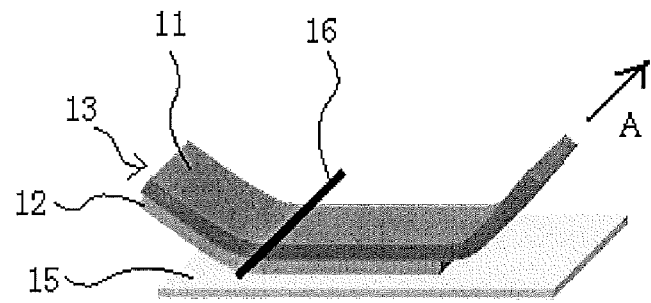
FIG. 1D is a schematic explanatory diagram showing one example of a cutting step in the method for transferring an adhesive film of the present invention (part 2).

The cutting step is bringing a high temperature heating part, which is disposed downstream or upstream of the heating part with respect to the conveyance direction of the adhesive film, into contact with the adhesive film from the side of the release layer and heating the adhesive layer up to the second heating temperature so as to cut the adhesive layer. For example as shown in FIGS. 1C and 1D, in the cutting step, a high temperature unit 16 (e.g. a heat source whose edge has a minute area), which is disposed downstream of the heating head 14 with respect to the conveyance direction (the direction shown with the arrow A) of the adhesive film 13, is brought into contact with the adhesive film 13, the adhesive layer 12 is heated up to the second heating temperature so as to be melted and softened, and then the adhesive layer is fusion cut or cut. Here, the second heating temperature is a temperature is higher than the first heating temperature, is a temperature at which the adhesive layer 12 is melted and softened, and is lower than the softening point of the base film 11 and/or the temperature at which the adhesive layer 12 is completely thermally cured. Generally, the second heating temperature is preferably 50° C. to 190° C., more preferably 90° C. to 150° C.

Figure 1E:
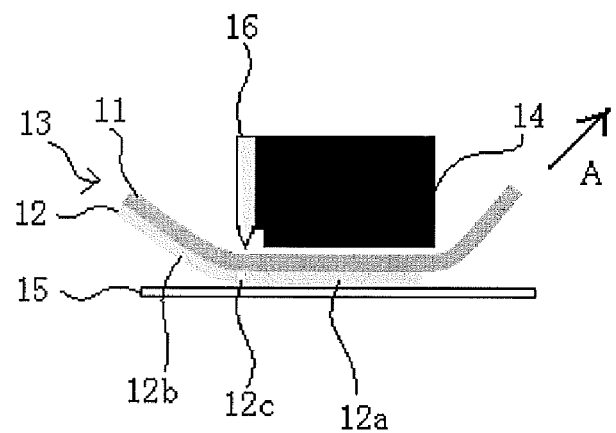
FIG. 1E is a schematic explanatory diagram showing one example of a heating head added with a high temperature unit (integrated type).

Moreover, the heating head 14 and the high temperature unit 16 may be independently disposed or integratedly disposed (FIG. 1E), but it is preferred that the heating head 14 and the high temperature unit 16 are independent from each other in view of the temperature control.

When the base film 11 is peeled off from the adhesive layer 12a that is temporarily adhered to the panel 15 in the releasing step described later, the timing for bringing the high temperature unit 16 in contact with the adhesive film 13 may be before, at the same time as, or after the pressurizing process in which the adhesive film 13 is pressurized with the heating head 14 from the side of the base film 11, provided that the curing portion 12c of the adhesive layer 12 is heated up to the second heating temperature. Namely, the pressurizing step and the cutting step may be performed in this order, in reverse, or at the same time.

<Transferring Step>

Figure 1F:
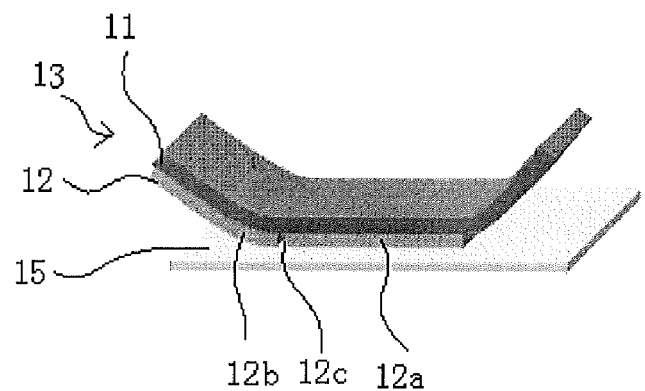
FIG. 1F is a schematic explanatory diagram showing one example of a transferring step in the method for transferring an adhesive film of the present invention.
Figure 2A:
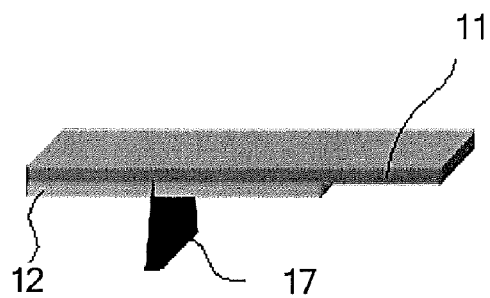
FIG. 2A is a schematic explanatory diagram showing one example of a half cut system (part 1).
Figure 2B:
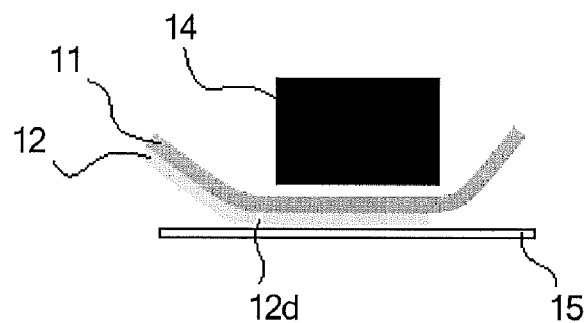
FIG. 2B is a schematic explanatory diagram showing one example of a half cut system (part 2)
Figure 2C:
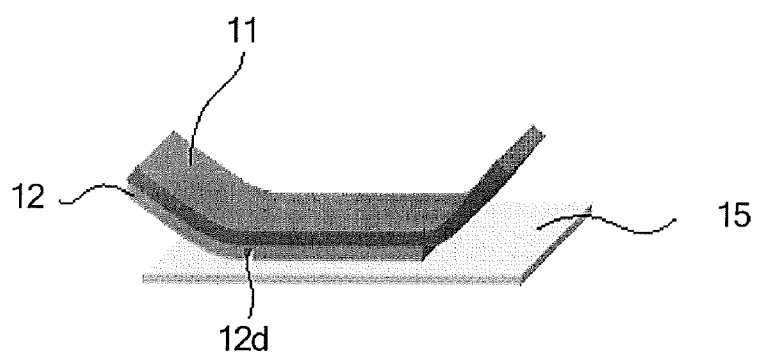
FIG. 2C is a schematic explanatory diagram showing one example of a half cut system (part 3)
Figure 2D:
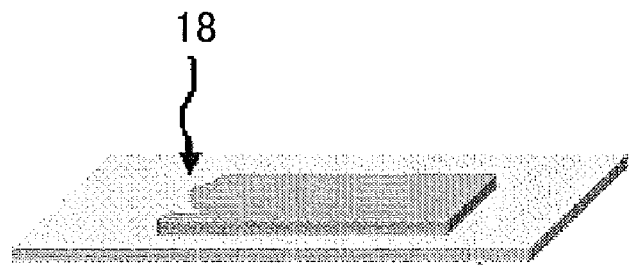
FIG. 2D is a schematic explanatory diagram showing one example of a bonding failure (part 1).
Figure 2E:
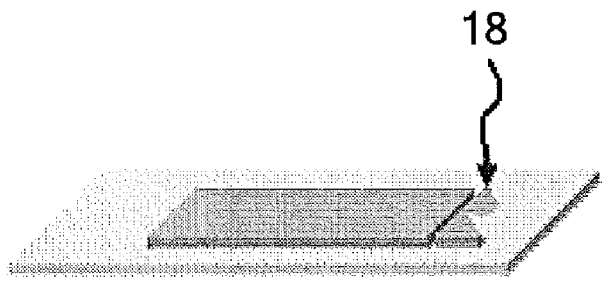
FIG. 2E is a schematic explanatory diagram showing one example of a bonding failure (part 2).
Figure 2F:
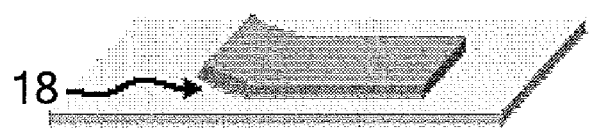
FIG. 2F is a schematic explanatory diagram showing one example of a bonding failure (part 3).
Figure 3A:
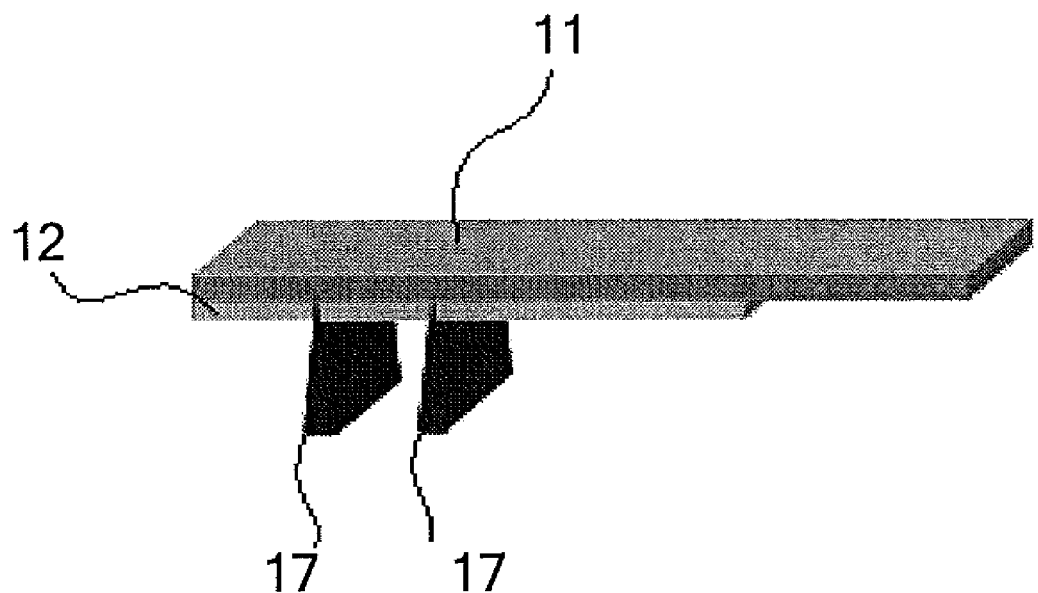
FIG. 3A is a schematic explanatory diagram showing one example of a cut-out system (part 1).
Figure 3B:
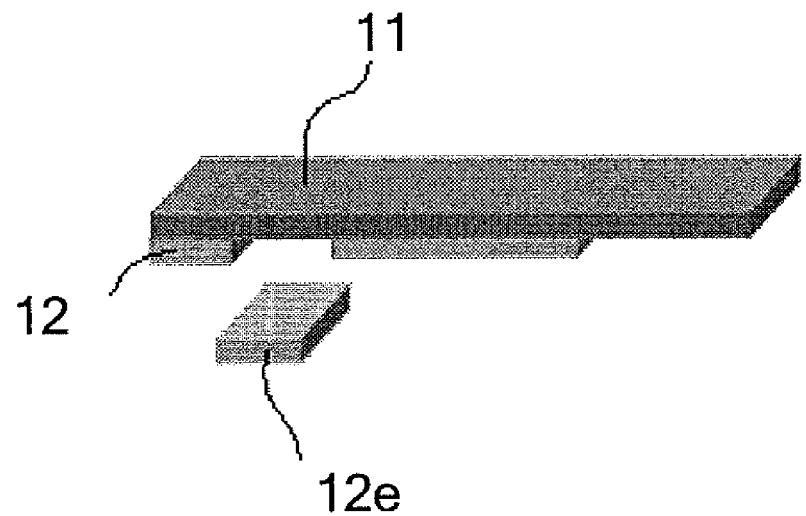
FIG. 3B is a schematic explanatory diagram showing one example of a cut-out system (part 2).

The transferring step is releasing the release layer from the adhesive layer which is in contact with the adherend so as to transfer the adhesive layer which is in contact with the adherend to the adherend. For example, in this transferring step, base film 11 is pulled up together with the adhesive layer 12b (the portion thereof where is not temporarily adhered to the panel 15), and is released from the adhesive layer 12a which has been temporarily adhered to the panel 15 so that the adhesive layer 12a which has been temporarily adhered to the panel 15 is transferred to the panel 15 (see FIG. 1F).

<Other Steps>

The aforementioned other steps may be suitably selected depending on the intended purpose without any restriction.

In accordance with the method for transferring an adhesive film of the present invention, as well as improving the product stability by reducing the impurities trapped in the adhesive layer 12, the adhered area of the adhesive layer 12a that is transferred to the panel 15 and the panel 15 can be ensured by preventing any defect or loss of the edge portion of the adhesive layer 12a transferred to the panel 15, to thereby improve adhesive strength of the adhesive layer 12a transferred to the panel 15.

In addition, according to the method for transferring an adhesive film of the present invention, not only that the conditions for cutting the adhesive layer 12 can be easily controlled (managed), the step for transferring the adhesive layer 12 is simplified to thereby simplify the structure of a preattachment device.

EXAMPLES

Hereinafter, examples of the present invention will be explained, but these examples shall not be construed as limiting the scope of the present invention.

Example 1

Preparation of Adhesive Film

A resin composition was prepared by mixing 30 parts by mass of epoxy resin (EP828, manufactured by Japan Epoxy Resins Co., Ltd.) as a binder resin, 20 parts by mass of epoxy resin (EP1004, manufactured by Japan Epoxy Resins Co., Ltd.), 20 parts by mass of phenoxy resin (PKHH, manufactured by In Chem), 30 parts by mass of an epoxy curing agent (HX3941HP, manufactured by Asahi Kasei Corporation), and 20 parts by mass of conductive particles (the one including resin cores having an average particle size of 3 μm, plated with Ni/Au, manufactured by Sekisui Chemical Co., Ltd.). To the resin composition, 80 parts by mass of toluene/ethyl acetate (the mixing ratio of 1:1) was added as a solvent, and the mixture was dissolved and mixed by a mixer to thereby prepare a paste.

The prepared paste was applied on a silicone-treated (release-processed) polyethylene terephthalate (PET) film (thickness of 38 μm) by means of a bar coater, heated in an electric oven set at 70° C. for 8 minutes, to thereby prepare an adhesive film containing an adhesive layer (ACF layer) having a thickness of 20 μm on the dry basis.

—Transfer of Adhesive Film—

The prepared adhesive film was cut into a piece having a width of 2 mm, the cut adhesive film was placed on ITO pattern glass (thickness of 0.4 mm), and the adhesive film was pressurized by a preattachment device (heating part) set at 80° C. from the side of the PET film to thereby heat the ACF layer and temporarily adhere the same to the ITO pattern glass. Then, a heating coil (high temperature heating port), which had been previously heated at the predetermined temperature, was brought into contact with the adhesive film from the side of the PET film (downstream of the preattachment device (heating part) with respect to the conveyance direction of the adhesive film) for 3 seconds, a portion of the ACF layer to be cut was heated up to 150° C. to thereby cut the ACF layer, and soon after the cutting, the PET film was pulled up, to thereby release the PET film from the ACF layer which had been temporarily adhered to the ITO pattern glass and transfer the ACF layer, which had been temporarily adhered to the ITO pattern glass, to the ITO pattern glass.

The ITO pattern glass onto which the ACG layer was transferred was measured in terms of the adhesive property and conduction reliability in the following manners. The results are shown in Table 1.

<Adhesive Property>

A Sellotape (registered trade mark) was laminated onto the ACF layer transferred on the ITO pattern glass, and then soon after the Sellotape (registered trade mark) was peeled off. The condition of the ACF layer remained on the ITO pattern glass was observed.

<Conduction Reliability>

The IC chip described below was mounted on the ITO pattern glass onto which the ACF layer was transferred, and the resistance was measured. In addition, the sample to which the IC chip had been mounted was left in the atmosphere of 85° C., 85% RH, for 200 hours, and the resistance was again measured after being left. Note that, the edge portion of the IC chip and the adhering edge portion of the ACF layer were aligned so as to meat each other, and were adjusted so that no conductive particle was present in the bump portion of the IC chip, as if there was some defect or loss in the ACF layer.

—IC Chip—

IC chip having a size of 1.8 mm×20 mm×0.5 mm (thickness), and having bumps, each of which has an area of 2,550 $\mu m^2$.

Example 2

An adhesive film containing a NCF layer was prepared in the same manner as in Example 1, provided that the resin composition was prepared without mixing 20 parts by mass of conductive particles (the one including resin cores having an average particle size of 3 μm, plated with Ni/Au, manufactured by Sekisui Chemical Co., Ltd.), the NCF layer was transferred onto the ITO pattern glass, and the ITO pattern glass onto which the NCF layer had been transferred was measured in terms of the adhesive property. The result is shown in Table 1.

Comparative Example 1

An adhesive film was prepared in the same manner as in Example 1, provided that the heat cut described as "the cut adhesive film was placed on an ITO pattern glass (thickness of 0.4 mm), and the adhesive film was pressurized by a preattachment device (heating part) set at 80° C. from the side of the PET film to thereby heat the ACF layer and temporarily adhere the same to the ITO pattern glass. Then, a heating coil (high temperature heating port), which had been previously heated at the predetermined temperature, was brought into contact with the adhesive film from the side of the PET film (downstream of the preattachment device (heating part) with respect to the conveyance direction of the adhesive film) for 3 seconds, a portion of the ACF layer to be cut was heated up to 150° C. to thereby cut the ACF layer" in Example 1 was changed to "a half cut was performed by inserting a knife into the ACF layer of the adhesive film (downstream of the preattachment device (heating part) with respect to the conveyance direction of the adhesive film) and applying approximately 20 mm cut, the half cut adhesive film was placed on an ITO pattern glass (thickness of 0.4 mm), and the adhesive film was pressurized by a preattachment device (heating part) set at 80° C. from the side of the PET film to thereby heat the ACF layer and temporarily adhere the same to the ITO pattern glass." Then, the ACF layer was transferred to the ITO pattern glass, and the ITO pattern glass onto which the ACF layer had been transferred was measured in terms of the conduction reliability. The results are shown in Table 1.

Comparative Example 2

An adhesive film was prepared in the same manner as in Example 2, provided that the heat cut performed in Example 2, i.e. "the cut adhesive film was placed on an ITO pattern glass (thickness of 0.4 mm), and the adhesive film was pressurized by a preattachment device (heating part) set at 80° C. from the side of the PET film to thereby heat the NCF layer and temporarily adhere the same to the ITO pattern glass. Then, a heating coil (high temperature heating port), which had been previously heated at the predetermined temperature, was brought into contact with the adhesive film from the side of the PET film (downstream of the preattachment device (heating part) with respect to the conveyance direction of the adhesive film) for 3 seconds, a portion of the NCF layer to be cut was heated up to 150° C. to thereby cut the NCF layer" was changed to "a half cut was performed by inserting a knife into the NCF layer of the adhesive film (downstream of the preattachment device (heating part) with respect to the conveyance direction of the adhesive film) and applying approximately 20 mm cut, the half cut adhesive film was placed on an ITO pattern glass (thickness of 0.4 mm), and the adhesive film was pressurized by a preattachment device (heating part) set at 80° C. from the side of the PET film to thereby heat the NCF layer and temporarily adhere the same to the ITO pattern glass." Then, the NCF layer was transferred to the ITO pattern glass, and the ITO pattern glass onto which the NCF layer had been transferred was measured in terms of the adhesive property. The result is shown in Table 1.

TABLE 1

|  | Ex. 1 | Ex. 2 | Comp. Ex. 1 | Comp. Ex. 2 |
| --- | --- | --- | --- | --- |
| Cutting method | Heat cut | Heat cut | Half cut | Half cut |
| Sample | ACF | NCF | ACF | NCF |
| Sellotepe test | No peeling | No peeling | Cut portion was peeled or lost | Cut portion was peeled or lost |
| Resistance (Ω) (initial value) | 1.1 | — | 2.8 | — |
| Resistance (Ω) (after standing in high temperature-high humidity) | 5.2 | — | 500 or more (disconnection) | — |

In Table 1, the resistance (Ω) is the maximum value (Max value) thereof.

From the results shown in Table 1, it was found that the adhesive layers (ACF layer and NCF layer) of Examples 1 and 2 cut by heat cut could each ensured the contact area with the ITO pattern glass by preventing peeling and/or low of the cut portion (edge portion), and had higher adhesive strength with the ITO pattern glass than that of the adhesive layers of Comparative Examples 1 and 2 cut by half cut.

Moreover, from the results shown in Table 1, it was found that the ACF layer (Example 1) cut by heat cut could ensure excellent electric connection, no disconnection occurred even after being left in the atmosphere of high temperature and high humidity, and high conduction reliability could be attained, whereas the ACF layer (Comparative Example 1) cut by half cut had peeling or loss in the cut portion, excellent electric connection could not be ensured, and high conduction reliability could not be attained.

Experimental Example 1

Preparation of Adhesive Film

A resin composition was prepared by mixing 30 parts by mass of epoxy resin (EP828, manufactured by Japan Epoxy Resins Co., Ltd.) as a binder resin, 20 parts by mass of epoxy resin (EP1004, manufactured by Japan Epoxy Resins Co., Ltd.), 20 parts by mass of phenoxy resin (PKHH, manufactured by In Chem), and 30 parts by mass of an epoxy curing agent (HX3941HP, manufactured by Asahi Kasei Corporation). To the resin composition, 80 parts by mass of toluene/ethyl acetate (the mixing ratio of 1:1) was added as a solvent, and the mixture was dissolved and mixed by a mixer to thereby prepare a paste.

The prepared paste was applied on a silicone-treated (release-processed) polyethylene terephthalate (PET) film (thickness of 38 μm) by means of a bar coater, heated in an electric oven set at 70° C. for 8 minutes, to thereby prepare an adhesive film containing an adhesive layer (NCF layer) having a thickness of 20 μm on the dry basis.

—Transfer of Adhesive Film—

The prepared adhesive film was cut into a piece having a width of 2 mm, the cut adhesive film was placed on low alkaline glass (thickness of 0.5 mm), and the adhesive film was pressurized by a preattachment device (heating part) set at 80° C. from the side of the PET film to thereby heat the NCF layer and temporarily adhere the same to the low alkaline glass. Then, a heating coil (high temperature heating port), which had been previously heated at the predetermined temperature, was brought into contact with the adhesive film from the side of the PET film (downstream of the preattachment device (heating part) with respect to the conveyance direction of the adhesive film) for 3 seconds, a portion of the NCF layer to be cut was heated up to the temperature shown in Table 2 to thereby cut the NCF layer, and soon after the cutting, the PET film was pulled up, to thereby release the PET film from the NCF layer which had been temporarily adhered to the low alkaline glass and transfer the NCF layer, which had been temporarily adhered to the low alkaline glass, to the low alkaline glass.

The low alkaline glass onto which the NCF layer had been transferred was measured in terms of the transfer property and reactivity in the following manner. The results are shown in Table 2.

<Transfer Property>

The transferred condition of the NCF layer to the low alkaline glass was judged based on the following criteria. The results are shown in Table 2.

A: The NCF layer was transferred onto the low alkaline glass.
B: The NCF layer was partially transferred onto the low alkaline glass (in the condition that part of the NCF layer temporarily adhered was detached from the low alkaline glass).
C: The NCF layer was not transferred onto the low alkaline glass.

<Reactivity>

A sample taken from the cut portion of the NCF layer was measured by FT-IR, and the reactivity (%) thereof was calculated based on the following formula (1). The results are shown in Table 2.

$$\text{Reactivity}(\%) = (1-(a/b)/(A/B)) \times 100 \tag{1}$$

Note that, in the formula (1), A represents absorbance which is originated from epoxy groups in the uncured NCF layer, B represents absorbance which is originated from the methyl groups in the uncured NCF layer, a represents absorbance which is originated from the epoxy groups in the cured NCF layer, and b represents absorbance which is originated from the methyl groups in the cured NCF layer.

TABLE 2

| | Cutting temperature (° C.) | | | | | | | | |
|---|---|---|---|---|---|---|---|---|---|
| | 30 | 50 | 70 | 90 | 110 | 130 | 150 | 170 | 190 |
| Transfer property | C | B | B | A | A | A | A | A | A |
| Reactivity (%) | 5 or less | 5 or less | 5 or less | 5 or less | 5 or less | 5 or less | 5 or less | 8 | 27 |

From the results shown in Table 2, it was found that the transfer of the NCF layer was possible at the cutting temperature of 50° C. or more. When the cutting temperature was less than 50° C., the cut portion of the NCF layer was not softened, and thus the NCG layer temporarily adhered to the PET film was pulled up with still being attached to the PET film, and the adhesive film could not be maintain its shape.

Moreover, when the cutting temperature was 50° C. to 70° C., the cut portion of the NCF layer was not softened enough, and thus part of the NCF layer temporarily adhered to the PET film was pulled up with still being attached to the PET film, and the part of the NCF film temporarily adhered to the PET film was detached from the low alkaline glass.

Furthermore, when the curing temperature was 170° C. or more (170° C., 190° C.), it was found from the reactivity (8%, 27%) of the NCF layer that the thermal curing of the NCF layer was started. Here, although it is preferred that the thermal curing of the NCF layer be started in view of the stability of the cut shape, it is not a problem in practical use, provided that the cut portion is not a portion to be mounted.

As has been mentioned above, the cutting temperature is preferably 50° C. to 190° C.

The method for transferring an adhesive film of the present invention is capable of efficiently transferring an adhesive layer of the adhesive film, and is suitably used in, for example, the productions of IC tags, IC cards, flat panel displays and the like.

What is claimed is:

1. A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method comprising:

conveying the adhesive film to an area between the heating part and the adherend;

pressurizing the adhesive film with the heating part from the side of the release layer and heating the adhesive layer up to a first heating temperature so as to bring the adhesive layer into contact with the adherend;

bringing a high temperature heating part, which is disposed downstream of the heating part with respect to the conveyance direction of the adhesive film, into contact with the adhesive film from the side of the release layer, and heating the adhesive layer up to a second heating temperature so as to cut the adhesive layer; and releasing the release layer from the adhesive layer which is in contact with the adherend, and transferring the adhesive layer which is in contact with the adherend to the adherend.

2. A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method comprising:

conveying the adhesive film to an area between the heating part and the adherend;

bringing a high temperature heating part, which is disposed upstream of the heating part with respect to the conveyance direction of the adhesive film, into contact with the adhesive film from the side of the release layer, and heating the adhesive layer up to a second heating temperature so as to cut the adhesive layer;

pressurizing the adhesive film with the heating part from the side of the release layer and heating the adhesive layer up to a first heating temperature so as to bring the adhesive layer into contact with the adherend; and releasing the release layer from the adhesive layer which is in contact with the adherend, and transferring the adhesive layer which is in contact with the adherend to the adherend.

3. A method for transferring an adhesive film, in which the adhesive film including a release layer and an adhesive layer is pressurized with a heating part from the side of the release layer so as to bring the adhesive layer into contact with an adherend while heating of the adhesive layer, and the adhesive layer is transferred onto the adherend, the method comprising:

conveying the adhesive film to an area between the heating part and the adherend;

pressurizing the adhesive film with the heating part from the side of the release layer and heating the adhesive layer up to a first heating temperature so as to bring the adhesive layer into contact with the adherend;

bringing a high temperature heating part, which is disposed downstream of the heating part with respect to the conveyance direction of the adhesive film, into contact with the adhesive film from the side of the release layer, and heating the adhesive layer up to a second heating temperature so as to cut the adhesive layer; and releasing the release layer from the adhesive layer which is in contact with the adherend, and transferring the adhesive layer which is in contact with the adherend to the adherend, wherein the pressurizing and the bringing are carried out simultaneously.

4. The method for transferring the adhesive film according to claim 1, wherein the adhesive film has a width of 1 mm to 20 mm.

5. The method for transferring the adhesive film according to claim 1, wherein the adhesive layer comprises a binder resin and a curing agent, the binder resin comprising at least one of epoxy resin and acryl resin.

6. The method for transferring the adhesive film according to claim 5, wherein the second heating temperature is in the range of 50° C. to 190° C.

7. The method for transferring the adhesive film according to claim 1, wherein the adhesive layer comprises conductive particles.

8. The method for transferring the adhesive film according to claim 1, wherein the heating part and the high temperature heating part are integratedly mounted.

* * * * *